United States Patent
Okada

(10) Patent No.: US 8,154,100 B2
(45) Date of Patent: Apr. 10, 2012

(54) ELECTROMAGNETIC WAVE DETECTING ELEMENT

(75) Inventor: Yoshihiro Okada, Kanagawa (JP)

(73) Assignee: FUJIFILM Corporation, Tokyo (JP)

( * ) Notice: Subject to any disclaimer, the term of this patent is extended or adjusted under 35 U.S.C. 154(b) by 457 days.

(21) Appl. No.: 12/409,535

(22) Filed: Mar. 24, 2009

(65) Prior Publication Data

US 2009/0244343 A1    Oct. 1, 2009

(30) Foreign Application Priority Data

Mar. 31, 2008 (JP) ................................. 2008-093856

(51) Int. Cl.
*H01L 31/00* (2006.01)
(52) U.S. Cl. ........................................ 257/444; 257/448
(58) Field of Classification Search .................. 257/440, 257/443, 444, 448, E27.131, E27.132; 348/302, 348/E3.016
See application file for complete search history.

(56) References Cited

U.S. PATENT DOCUMENTS

| 6,607,935 B2 * | 8/2003 | Kwon .............................. 438/56 |
| 7,956,433 B2 * | 6/2011 | Okada et al. .................. 257/440 |
| 2002/0131011 A1 * | 9/2002 | Izumi ............................ 349/199 |

FOREIGN PATENT DOCUMENTS

JP    2004-33659    2/2004

* cited by examiner

*Primary Examiner* — Hung Vu
(74) *Attorney, Agent, or Firm* — SOLARIS Intellectual Property Group, PLLC

(57) ABSTRACT

The present invention is to provide an electromagnetic wave detecting element that can suppress the trapping of charges in a semiconductor layer. Plural lower electrodes, which collect charges generated in the semiconductor layer, are each provided to cover at least a portion in a length direction and the entire region in a width direction of a scan line adjacent thereto, and the lower electrodes are disposed at positions at which the scan lines are provided.

9 Claims, 11 Drawing Sheets

ELECTROMAGNETIC WAVE DETECTING ELEMENT

CROSS-REFERENCE TO RELATED APPLICATION

This application claims priority under 35 USC 119 from Japanese Patent Application No. 2008-093856, the disclosure of which is incorporated by reference herein.

BACKGROUND OF THE INVENTION

1. Field of the Invention

The present invention relates to an electromagnetic wave detecting element. In particular, the present invention relates to an electromagnetic wave detecting element that includes plural collection electrodes that collect charges generated in a semiconductor layer by electromagnetic waves being irradiated.

2. Description of the Related Art

Radiation image detection devices such as FPDs (flat panel detectors), in which an X-ray sensitive layer is disposed on a TFT (thin film transistor) active matrix substrate and that can convert X-ray information directly into digital data, and the like, have been put into practice in recent years. As compared with a conventional imaging plate, an image can be confirmed immediately at an FPD. Further, the FPD has the advantage that video images as well can be confirmed. Therefore, the popularization of FPDs has advanced rapidly.

Various types of radiation image detection devices are proposed. For example, there is a direct-conversion-type radiation image detection device that converts radiation directly into charges and accumulates the charges. Moreover, there is an indirect-conversion-type radiation image detection device that once converts radiation into light at a scintillator of CsI:Tl, GOS (Gd2O2S:Tb), or the like, and, at semiconductor layer, converts the converted light into charges and accumulates the charges.

As an example, FIG. 8 shows a plan view illustrating the constitution of a single pixel unit of a direct-conversion-type electromagnetic wave detecting element 10'. Further, a cross-sectional view along line A-A of FIG. 8 is shown in FIG. 9.

As shown in FIG. 8, the electromagnetic wave detecting element 10' is provided with sensor portions 103' and TFT switches 4', which correspond with intersection portions of plural scan lines 101' and plural signal lines 3', which are disposed to intersect one another.

As shown in FIG. 9, the sensor portion 103' includes a semiconductor layer 6', an upper electrode 7' and a lower electrode 11'. The semiconductor layer 6' generates charge when irradiated with X-rays. The upper electrode 7' applies a bias voltage to the semiconductor layer 6', and the lower electrode 11' collects the charge generated in the semiconductor layer 6'.

For example, when X-rays are irradiated from the upper side of FIG. 9, the semiconductor layer 6' generates charges thereinside. If a positive bias voltage is applied to the upper electrode 7' such that the upper electrode 7' is at a positive potential relative to the lower electrode 11', then among the charges generated inside the semiconductor layer 6', holes are gathered at the lower electrode 11' and are accumulated at a charge storage capacitor 5' which is electrically connected to the lower electrode 11'. On the other hand, if a negative bias is applied to the upper electrode 7', then among the charges generated inside the semiconductor layer 6', electrons are gathered at the lower electrode 11' and are accumulated at the charge storage capacitor 5'. Charge amounts that are generated in the semiconductor layer 6' vary in accordance with irradiated X-ray quantities. Therefore, charges corresponding to image information carried by the X-rays are accumulated in the charge storage capacitors of the respective pixels. Subsequently, signals turning the TFT switches 4' ON are sequentially applied through the scan lines 101' illustrated in FIG. 8. Then the charges accumulated in the charge storage capacitors 5' are fed out through the signal lines 3'.

However, in this kind of electromagnetic wave detecting element 10', a portion of the charges generated in the semiconductor layer 6' are trapped in the semiconductor layer 6'. Consequently, a portion of the generated charges may not be collected by the lower electrode 11', and a residual image may be formed.

FIG. 10 schematically illustrates a state in which the charges generated in the semiconductor layer 6' at a region of the scan line 101' of this kind of electromagnetic wave detecting element 10' are being collected. Note that FIG. 10 shows a cross-sectional view along line B-B of FIG. 8A.

As shown in FIG. 10, the generated charges are collected by the lower electrodes 11'. However, a portion of the generated charges are trapped at the semiconductor layer 6'.

In Japanese patent application laid-open (JP-A) No. 2004-33659, a technology that suppresses the creation of a residual image is described. In this technology, a light generator (a backlight device) is disposed at a rear face of the electromagnetic wave detecting element 10', and light is illuminated onto the electromagnetic wave detecting element 10' by the light generator.

When the technology recited in JP-A No. 2004-33659 is employed and light is illuminated onto the electromagnetic wave detecting element 10', there is a consistent effect of suppression of the creation of residual images which are caused by trapping of charges.

However, further suppression of residual images has been called for in recent years. Due thereto, suppression of the trapping of charges in the semiconductor layer 6' is essential for this.

SUMMARY OF THE INVENTION

The present invention is to provide an electromagnetic wave detecting element that can suppress trapping of charges in a semiconductor layer.

A first aspect of the present invention is an electromagnetic wave detecting element including: an insulative substrate; a plurality of scan lines and a plurality of signal lines that are disposed on the insulative substrate, to intersect one another, in different wiring layers with a first insulation film interposed; a plurality of collection electrodes, that collects generated charges, disposed respectively individually in correspondence with intersection portions of the plurality of scan lines and the plurality of signal lines, on a second insulation film layered above the plurality of scan lines and the plurality of signal lines; and a semiconductor layer, that generates charges when irradiated with predetermined electromagnetic waves, uniformly formed on a layer above the plurality of collection electrodes, wherein the plurality of collection electrodes are provided to each cover at least a portion in a longitudinal direction and the entire region in a lateral direction of at least one of the scan line or signal line that are adjacent to the respective collection electrode.

In the first aspect of the present invention, the plural scan lines and the plural signal lines are disposed on the insulative substrate, orthogonally to one another, in the different wiring layers with the first insulation film therebetween. The plural collection electrodes that collect generated charges are disposed respectively individually in correspondence with the intersection portions of the plural scan lines and the plural signal lines, in a layer above the plural scan lines and plural signal lines, with the second insulation layer therebetween. The semiconductor layer that generates charges when the predetermined electromagnetic waves are irradiated is uniformly formed in a layer above the plural collection electrodes.

In the present invention, the plural electrodes are each disposed so as to cover at a least a portion of the longitudinal direction and the entire region of the lateral direction of at least one line of the scan line and signal line that are adjacent thereto.

According to the first aspect, the plural electrodes that collect the charges generated in the semiconductor layer are each disposed so as to cover the at least a portion of the longitudinal direction and the entire region of the lateral direction of the at least one of the scan line and the signal line that are adjacent thereto. Thus, according to the first aspect, the collection electrodes are provided at positions at which the scan lines or signal lines are disposed. Due thereto, charges generated in the semiconductor layer at regions of the positions at which the scan lines or signal lines are disposed are collected by the collection electrodes rather than being trapped. Therefore, the present invention may suppress trapping of charges in the semiconductor layer.

A second aspect of the present invention may be, in the aspect described above, the electromagnetic wave detecting element wherein the plurality of collection electrodes are each provided with a portion extended over the second insulation film such that the respective collection electrode covers the at least a portion in the longitudinal direction and the entire region in the lateral direction of the at least one of the scan line and signal line.

A third aspect of the present invention may be, in an aspect described above, the electromagnetic wave detecting element wherein the plurality of collection electrodes are each provided so as to cover the at least a portion in the longitudinal direction and the entire region in the lateral direction of the scan line that is adjacent thereto.

A fourth aspect of the present invention may be, in an aspect described above, the electromagnetic wave detecting element wherein the plurality of scan lines each control extraction to the signal lines of the charges collected at the collection electrodes that are adjacent to the respective scan line at one side in the signal line direction, and the plurality of collection electrodes are superposed with the scan lines that are adjacent thereto at the one side in the signal line direction.

A fifth aspect of the present invention may be, in an aspect described above, the electromagnetic wave detecting element wherein the plurality of collection electrodes are superposed, with the scan lines that are respectively adjacent at the one side in the signal direction, with a predetermined alignment margin.

A sixth aspect of the present invention may be, in an aspect described above, the electromagnetic wave detecting element further including a plurality of thin film transistors that are disposed respectively individually in correspondence with the intersection portions of the plurality of scan lines and the plurality of signal lines, the plurality of the thin film transistors including, gate electrodes of the thin film transistors being electrically connected with the scan lines, source electrodes being electrically connected with either one of the signal lines or the collection electrodes, and drain electrodes being electrically connected with the other of the signal lines or the collection electrodes, wherein the plurality of collection electrodes are disposed so as to cover the thin film transistors to which the collection electrodes are electrically connected.

Herein, the meaning of the term "electromagnetic waves" is to include electromagnetic waves that are detected and cause charges to be generated at the above-mentioned semiconductor layer. For example, in the case of an indirect-conversion-type electromagnetic wave detecting element, light generated by a scintillator corresponds to the term electromagnetic waves. However, in the case of an indirect conversion type, the present invention may be applied only to a configuration in which the semiconductor layer is formed above the collection electrodes uniformly.

Thus, according to the present invention, charges that are generated in the semiconductor layer at regions of positions at which the scan lines or signal lines are disposed are collected by the collection electrodes rather than being trapped. Therefore, the present invention may suppress trapping of charges in the semiconductor layer.

BRIEF DESCRIPTION OF THE DRAWINGS

Exemplary embodiments of the present invention will be described in detail based on the following figures, wherein.

DETAILED DESCRIPTION OF THE INVENTION

Herebelow, exemplary embodiments of the present invention will be described while referring to the attached drawings. Note that, hereinafter, a case will be described in which the present invention is applied to a radiation image photography device 100 that employs a direct-conversion-type electromagnetic wave detecting element 10.

[First Embodiment]

Figure 1:
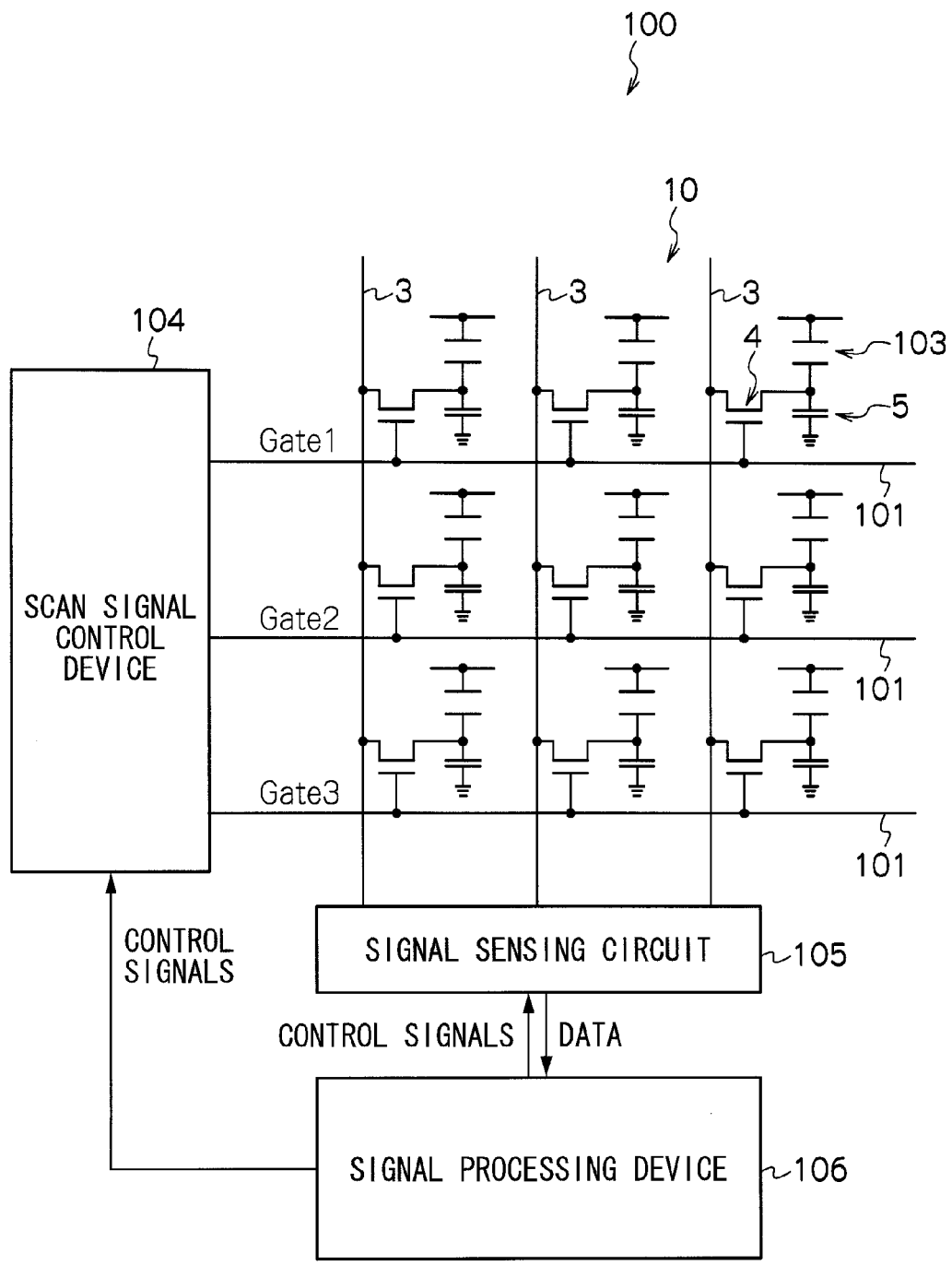
FIG. 1 is a structural view illustrating overall structure of a radiation image photography device relating to an exemplary embodiment.

FIG. 1 illustrates overall structure of the radiation image photography device 100 relating to the first exemplary embodiment.

As shown in FIG. 1, the radiation image photography device 100 relating to the present exemplary embodiment includes the electromagnetic wave detecting element 10.

The electromagnetic wave detecting element 10 is provided with an upper electrode, a semiconductor layer and lower electrodes, which will be described later. A large number of pixels that are structured to include sensor portions 103 and TFT switches 4 are provided in a two-dimensional form at the electromagnetic wave detecting element 10. The sensor portion 103 receives irradiated radiation and generates charges. The charge storage capacitor 5 accumulates the charges generated by the sensor portion 103. The TFT switch 4 reads out the charges that have been accumulated in the charge storage capacitor 5. One electrode of the charge storage capacitor 5 is grounded via a storage capacitor line 102 (see FIG. 2), which will be described later, and is set to ground level. In FIG. 1, the one electrode of each charge storage capacitor 5 is connected to ground individually.

In the electromagnetic wave detecting element 10, plural scan lines 101 and plural signal lines 3 are provided so as to intersect one another. The plural scan lines 101 turn the TFT switches 4 ON and OFF. The plural signal lines 3 read out the charges accumulated in the charge storage capacitors 5.

At each signal line 3, any of the TFT switches 4 connected to the signal line 3 is turned ON. Due thereto, an electronic signal corresponding to electronic charge accumulated in the charge storage capacitor 5 flows into the signal line 3. A signal sensing circuit 105, which senses the electronic signals flowing out through the signal lines 3, is connected to the signal lines 3. A scan signal control device 104 is connected to the scan lines 101. The scan signal control device 104 outputs control signals for turning the TFT switches 4 on the scan lines 101 ON and OFF.

The signal sensing circuit 105 incorporates amplification circuits that amplify the electronic signals inputted from each signal line 3. In the signal sensing circuit 105, the electronic signals inputted by the signal lines 3 are amplified by the amplification circuits and sensed. Due thereto, the signal sensing circuit 105 senses the charge amounts accumulated in the charge storage capacitors 5, to serve as information of pixels constituting an image.

A signal processing device 106, which applies predetermined processing to the electronic signals sensed at the signal sensing circuit 105, is connected to the signal sensing circuit 105 and the scan signal control device 104. The signal processing device 106 also outputs control signals representing timings of signal sensing to the signal sensing circuit 105, and outputs control signals representing timings of output of scan signals to the scan signal control device 104.

Figure 2:
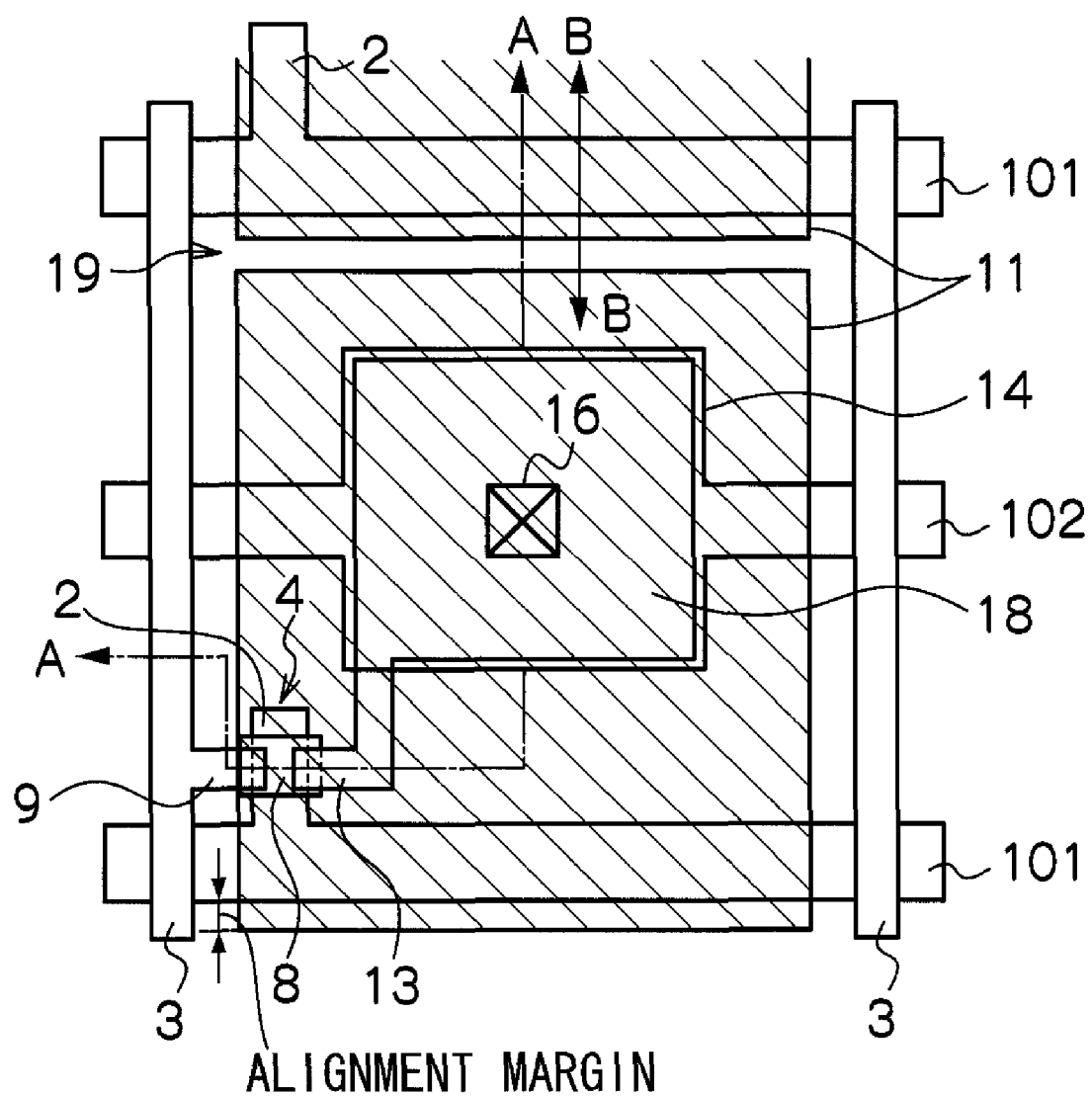
FIG. 2 is a plan view illustrating structure of one pixel unit of an electromagnetic wave detecting element relating to a first exemplary embodiment.
Figure 3:
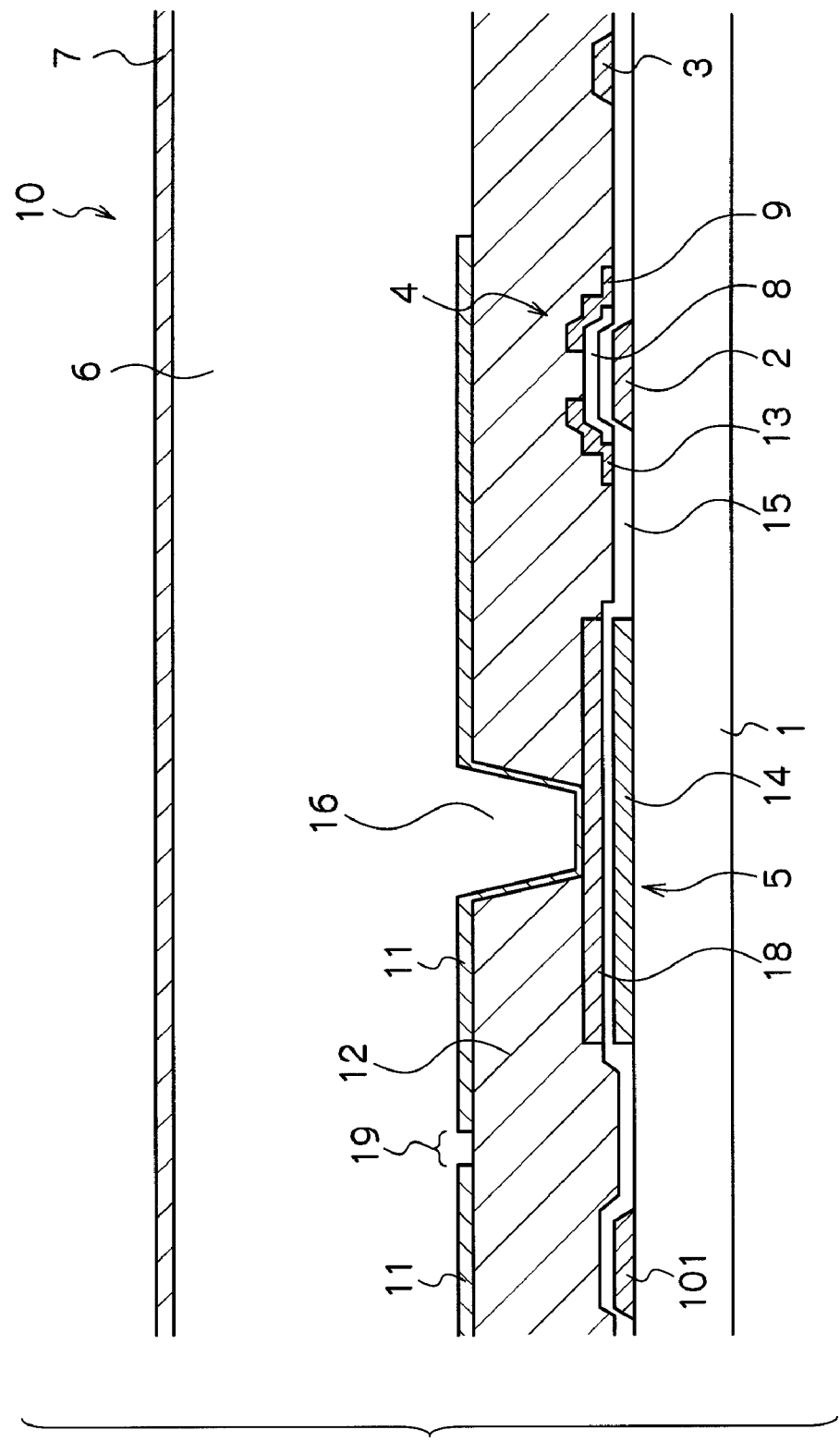
FIG. 3 is a cross-sectional view of the electromagnetic wave detecting element relating to the first exemplary embodiment.

Next, the electromagnetic wave detecting element 10 relating to the present exemplary embodiment will be described in more detail with reference to FIG. 2 and FIG. 3. FIG. 2 shows a plan view illustrating structure of a single pixel unit of the electromagnetic wave detecting element 10, relating to the present exemplary embodiment. FIG. 3 shows a cross sectional view along line A-A of FIG. 2.

As shown in FIG. 3, in the electromagnetic wave detecting element 10, the scan line 101, a storage capacitor lower electrode 14, a gate electrode 2 and the storage capacitor line 102 (see FIG. 2) are formed on an insulative substrate 1, which is formed of non-alkaline glass or the like. The gate electrode 2 is connected to the scan line 101, and the storage capacitor lower electrode 14 is connected to the storage capacitor line 102. A wiring layer, in which the scan line 101, the storage capacitor lower electrode 14 and the storage capacitor line 102 are formed (hereinafter, this wiring layer is referred to as the first signal wiring layer), is formed by using Al or Cu, or a layered film formed mainly of Al or Cu. However, the formation of the wiring layer is not limited to these.

An insulation film 15 is formed on substantially the entire surface of the region on the first signal wiring layer. A portion thereof that is disposed over the gate electrode 2 is utilized as a gate insulation film of the TFT switch 4. The insulation film 15 is formed of, for example, $SiN_x$ or the like, and is formed by, for example, CVD (chemical vapor deposition) film formation.

A semiconductor active layer 8 is formed on the insulation film 15 at a position corresponding with the gate electrode 2. The semiconductor active layer 8 is the channel of the TFT switch 4 and is formed of, for example, an amorphous silicon film.

A source electrode 9 and a drain electrode 13 are formed over the layers described above. The signal line 3 is formed together with the source electrode 9 and the drain electrode 13 in a wiring layer in which the source electrode 9 and the drain electrode 13 are formed. At a position on the insulation film 15 that corresponds with the storage capacitor lower electrode 14, a storage capacitor upper electrode 18 is formed. The source electrode 9 is connected to the signal line 3, and the drain electrode 13 is connected to the storage capacitor upper electrode 18 (see FIG. 2). Note that, the source electrode 9 and drain electrode 13 of the TFT switch 4 may be reversed in accordance with the polarity of charges to be accumulated at the storage capacitor line 102. The wiring layer in which the source electrode 9, the drain electrode 13, the storage capacitor upper electrode 18 and the signal line 3 are formed (hereinafter, this wiring layer is referred to as the second signal wiring layer), is formed by using Al or Cu, or a layered film formed mainly of Al or Cu. However, the formation of the wiring layer is not limited to these.

A contact layer (not shown) is formed between the source electrode 9 and drain electrode 13 and the semiconductor active layer 8. The contract layer is formed as an impurity-doped semiconductor layer, of impurity-doped amorphous silicon or the like. In the electromagnetic wave detecting element 10 relating to the present exemplary embodiment, the TFT switch 4 is configured by the gate electrode 2, the insulation film 15, the source electrode 9, the drain electrode 13 and a semiconductor layer 6. Further, the charge storage capacitor 5 is configured by the storage capacitor lower electrode 14, the gate insulation film 15 and the storage capacitor upper electrode 18, or the like.

An interlayer insulation film 12 is formed to cover the second signal wiring layer, over substantially the entire surface of the region at which the pixel is formed on the insulative substrate 1 (over substantially the entire region). The interlayer insulation film 12 is formed of an organic material such as acrylic resin or the like that has photosensitivity, with a film thickness of 1-4 μm and a relative permittivity of 2-4. In the electromagnetic wave detecting element 10 relating to the present exemplary embodiment, a capacitance between metals disposed in a layer above and the layer below the interlayer insulation film 12 is kept low by the interlayer insulation film 12. Further, generally, such a material also functions as a flattening film, and also has the effect of flattening the steps of the lower layer. Because the shapes of semiconductor layer 6 that are disposed at the upper layer are flattened thereby, a decrease in the absorption efficiency due to unevenness of the semiconductor layer 6, and an increase in leak current can be suppressed. Further, a contact hole 16 is formed in the interlayer insulation film 12 at a position opposing the storage capacitor upper electrode 18.

In each pixel, a lower electrode 11 of the sensor portion 103 is formed on the interlayer insulating film 12, so as to cover the pixel region while filling-in the contact hole 16. The lower electrode 11 is formed of an ITO (indium tin oxide) film, and is connected with the storage capacitor upper electrode 18.

In the present exemplary embodiment, the lower electrode 11 is configured so as to extend in the signal line direction on the interlayer insulation film 12, and so as to cover the TFT switch 4 to which the lower electrode 11 is electrically connected. Furthermore, the lower electrode 11 is provided so as to cover at least a portion of a longitudinal direction and the entire region of a lateral direction of the scan line 101 to which the lower electrode 11 is electrically connected via the TFT switch 4, with a predetermined alignment margin (for example, 2-5 µm). With this structure, the lower electrode 11 completely covers a portion of positions at which the scan line 101 is disposed. Moreover, the lower electrode 11 is disposed such that respective gaps 19 between the lower electrodes 11 that are adjacent to one another in the signal line direction are away from the positions at which the scan lines 101 are disposed.

The semiconductor layer 6 is uniformly formed on the lower electrode 11 over substantially the entire surface of a pixel region in which pixels are provided on the insulative substrate 1 (a detection target region). Electromagnetic waves such as X-rays or the like are irradiated at the semiconductor layer 6. Accordingly, the semiconductor layer 6 generates charges (electrons and holes) thereinside. That is, the semiconductor layer 6 features conductivity for electromagnetic waves and converts image information in the X-rays to charge information. The semiconductor layer 6 is formed of, for example, a-Se (amorphous selenium), of which selenium is the principal component. Here, the meaning of the term principal component is the inclusion of a content of at least 50%.

An upper electrode 7 is formed on the semiconductor layer 6. A bias power source 30, to be described later (see FIG. 4), is connected to the upper electrode 7. A bias voltage is provided from the bias power source 30.

Hereafter, principles of operation of the radiation image photography device 100 relating to the present implement will be described.

In a state in which a bias voltage is applied between the upper electrode 7 and the storage capacitor lower electrode 14, when X-rays are irradiated at the semiconductor layer 6, charges (electron-hole pairs) are generated inside the semiconductor layer 6.

The semiconductor layer 6 and the charge storage capacitor 5 are configured to be electrically connected in series. Therefore, electrons generated in the semiconductor layer 6 migrate to a positive (plus) electrode side and holes migrate to a negative (minus) electrode side. During image sensing, a negative bias is applied to the gate electrode 2 of the TFT switch 4, keeping the TFT switch 4 turned OFF. Consequently, the electrons that are generated in the semiconductor layer 6 are collected by the lower electrode 11 and accumulated at the charge storage capacitor 5. However, a portion of the charges that are generated are trapped in the semiconductor layer 6.

The inventors of the present invention have discovered that many charges are trapped at positions of the semiconductor layer 6 at which the scan line 101 or the signal line 3 is disposed. A cause of this is that, because the scan line 101 and the signal line 3 are fixed at particular potentials during image sensing, the electric field that is supposed to be applied between the upper electrode 7 and the lower electrode 11 (the collection electrode) is also applied between the upper electrode 7 and the scan line 101 or the signal line 3. Thus, rather than approaching the lower electrode 11, the charges generated in the semiconductor layer 6 are likely to be trapped, by lines of electric force that are formed from the upper electrode 7 to the scan line 101 or the signal line 3, in the vicinity of a boundary between the interlayer insulation film 12 and the semiconductor layer 6 that is disposed in the layer above the scan line 101 or signal line 3.

Accordingly, in the present exemplary embodiment, the lower electrode 11 is provided to extend in the signal line direction over the interlayer insulation film 12, and is provided such that at least a portion in the longitudinal direction and the entire region in the lateral direction of the scan line 101 are covered by the lower electrode 11. Furthermore, the lower electrode 11 is provided such that the gaps 19 between the lower electrodes 11 that are adjacent to one another in the signal line direction avoid the positions at which the scan lines 101 are disposed.

Figure 4:
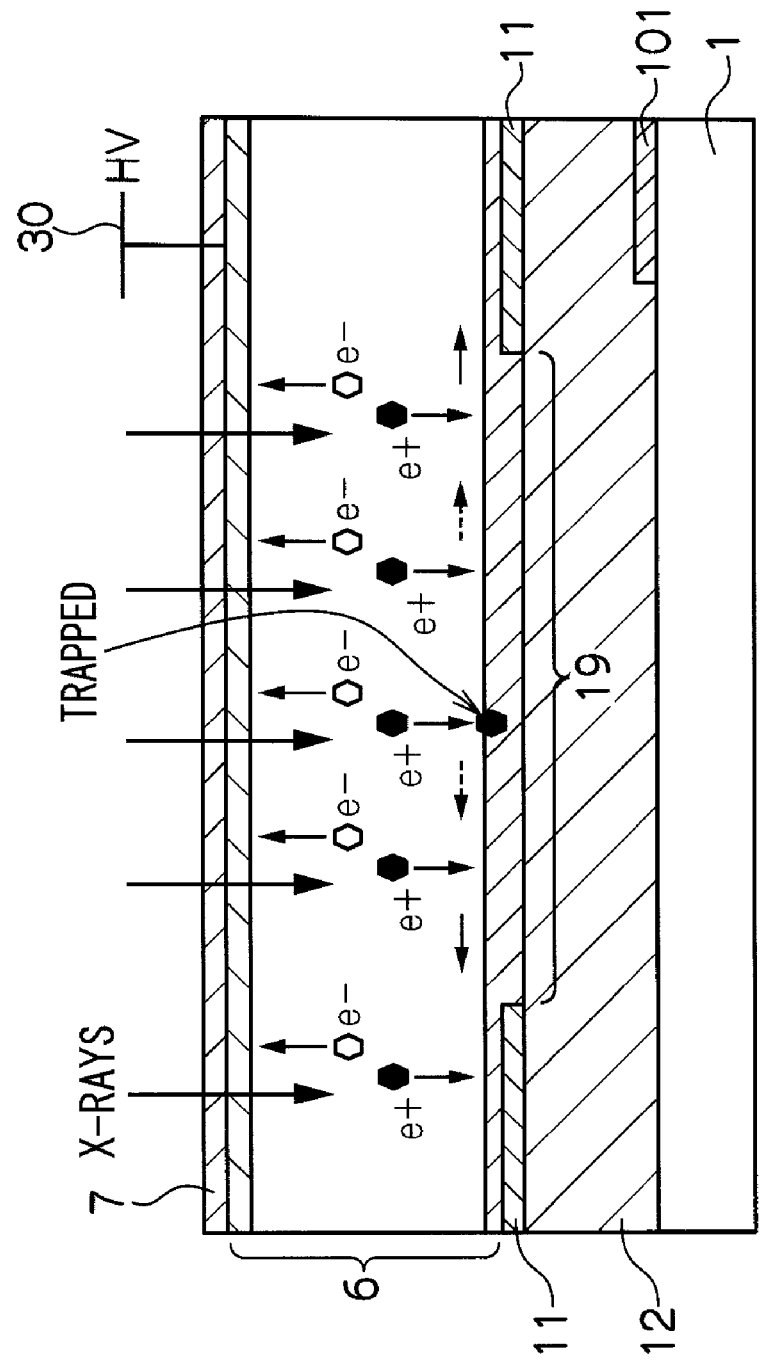
FIG. 4 is a schematic view illustrating a state in which charge generated in a semiconductor layer is being collected at a scan line region of the electromagnetic wave detecting element relating to the first exemplary embodiment.

FIG. 4 schematically illustrates a state in which charges generated are being collected in the semiconductor layer 6 at the scan line 101 region of the electromagnetic wave detecting element 10 relating to the present exemplary embodiment. FIG. 4 is a cross sectional view along line B-B of FIG. 2.

As shown in FIG. 4, because the lower electrode 11 is superposed with the scan line 101, the lower electrode 11 is provided at positions at which the scan line 101 is disposed and collects charges of the semiconductor layer 6. As a result, trapping of charges in the semiconductor layer is suppressed. This is thought to be because there is no wiring that is fixed at a particular potential in the region of the gap 19, consequently lines of electric force in the region of the gap 19 are curved towards the lower electrodes, and thus trapped charges are reduced.

Now, many charges are trapped at positions at which the signal line 3 is disposed. Accordingly, the lower electrode 11 may be disposed at positions at which the signal line 3 is disposed, by the lower electrode 11 being provided on the interlayer insulation film 12 to extend in the scan line direction and being superposed with the signal line 3. However, if the signal line 3 and the lower electrode 11 are superposed, the electrostatic capacitance of the signal line 3 will be larger, and noise produced at the signal line 3 will be greater. Therefore, in the present exemplary embodiment the lower electrode 11 is superposed only with the scan line 101.

Moreover, in the present exemplary embodiment, the lower electrode 11 is superposed with the scan line 101 with the predetermined alignment margin. Therefore, the lower electrode 11 is completely superposed with the scan line 101. With this structure, variations in the electrostatic capacitance of the scan line 101 are suppressed by the lower electrode 11. That is, the electrostatic capacitance of the scan line 101 varies with the size of a region at which the lower electrode 11 is superposed. For example, if there was no alignment margin, shifting of the positions of the lower electrodes 11 in the signal line direction would occur due to fabrication errors, alignment offsets and the like during fabrication of the electromagnetic wave detecting element 10. When a shift occurred, the lower electrode 11 would not cover the entire region of the scan line 101 but be superposed with a portion of the scan line 101, and the electrostatic capacitance would change greatly in accordance with the degree of this superposition. Therefore, in the present exemplary embodiment, the lower electrode 11 is superposed with the scan line 101 with the predetermined alignment margin.

Furthermore, in the present exemplary embodiment, the lower electrode 11 is provided so as to cover the TFT switch 4 that is electrically connected to the lower electrode 11. With this structure, if a large quantity of charge is generated in the semiconductor layer 6, collected by the lower electrode 11 and accumulated in the charge storage capacitor 5, the potential of the lower electrode 11 rises and the TFT switch 4 turns ON, and the charge flows out into the signal line 3. Thus, the above-described structure functions as a protection circuit that protects the sensor portion 103, the TFT switch 4 and the like from excessive charges.

During image reading, ON signals (+10 to 20 V) are sequentially applied through the scan lines 101 to the gate electrodes 2 of the TFT switches 4. Thus, the TFT switches 4 are sequentially turned ON, and electronic signals corresponding to the charge amounts accumulated in the charge storage capacitors 5 flow out into the signal lines 3. The signal sensing circuit 105 senses the charge amounts accumulated at the charge storage capacitors 5 of the sensor portions 103 as information of the respective pixels. Thus, the electromagnetic wave detecting element 10 may provide image information representing an image represented by the irradiated X-rays.

As described above, according to the present exemplary embodiment, the plural lower electrodes 11 that collect charges generated in the semiconductor layer 6 are provided so as to cover at least a portion in the longitudinal direction and entire region of the lateral direction of the respective adjacent scan lines 101. The lower electrodes 11 are provided at positions at which the scan lines 101 are disposed. Due thereto, the present exemplary embodiment may suppress trapping of charges in the semiconductor layer 6.

[Second Embodiment]

Structure of the radiation image photography device 100 relating to a second exemplary embodiment is the same as in the first exemplary embodiment described above (see FIG. 1), therefore detailed descriptions thereof will be omitted.

Figure 5:
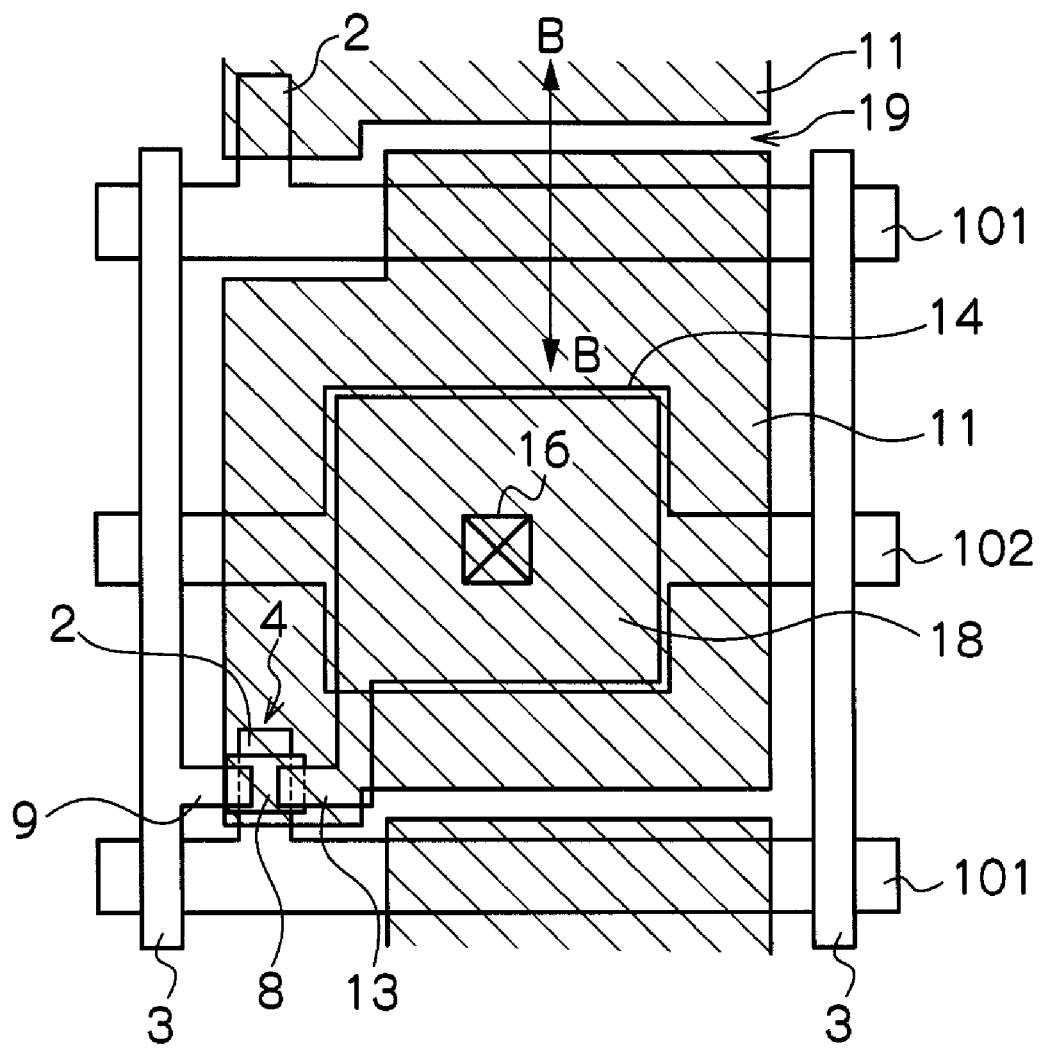
FIG. 5 is a plan view illustrating structure of a single pixel unit of an electromagnetic wave detecting element relating to a second exemplary embodiment.

FIG. 5 shows a plan view illustrating the constitution of a single pixel unit of the electromagnetic wave detecting element 10 relating to the present exemplary embodiment. Portions that are the same as in the first exemplary embodiment are assigned the same reference numerals, and therefore detailed descriptions thereof will be omitted.

As shown in FIG. 5, each scan line 101 is electrically connected to the TFT switch 4 that is adjacent at one side thereof in the signal line direction (at the upper side in FIG. 5). The scan line 101 controls extraction to the signal line 3 of charge collected at the lower electrode 11 that is adjacent at the one side thereof in the signal line direction.

In the present exemplary embodiment, a portion of the lower electrode 11 is provided extending further to the one side in the signal line direction and is superposed with the scan line 101 that is adjacent to the one side thereof, with a predetermined alignment margin. Another portion of the lower electrode 11 is provided extending to the other side in the signal line direction, and is provided so as to cover the TFT switch 4 to which the lower electrode 11 is electrically connected. Superposing the entire region of connection between the TFT switch 4 and the scan line 101 with the lower electrode 11, with the predetermined alignment margin, is difficult in regard to arrangement of the lower electrode 11. Therefore, in the present exemplary embodiment, the gap 19 between the lower electrodes 11 that are adjacent to one another in the signal line direction is provided so as to avoid positions at which the scan line 101 is disposed, except at the region of connection between the TFT switch 4 and the scan line 101.

Figure 6:
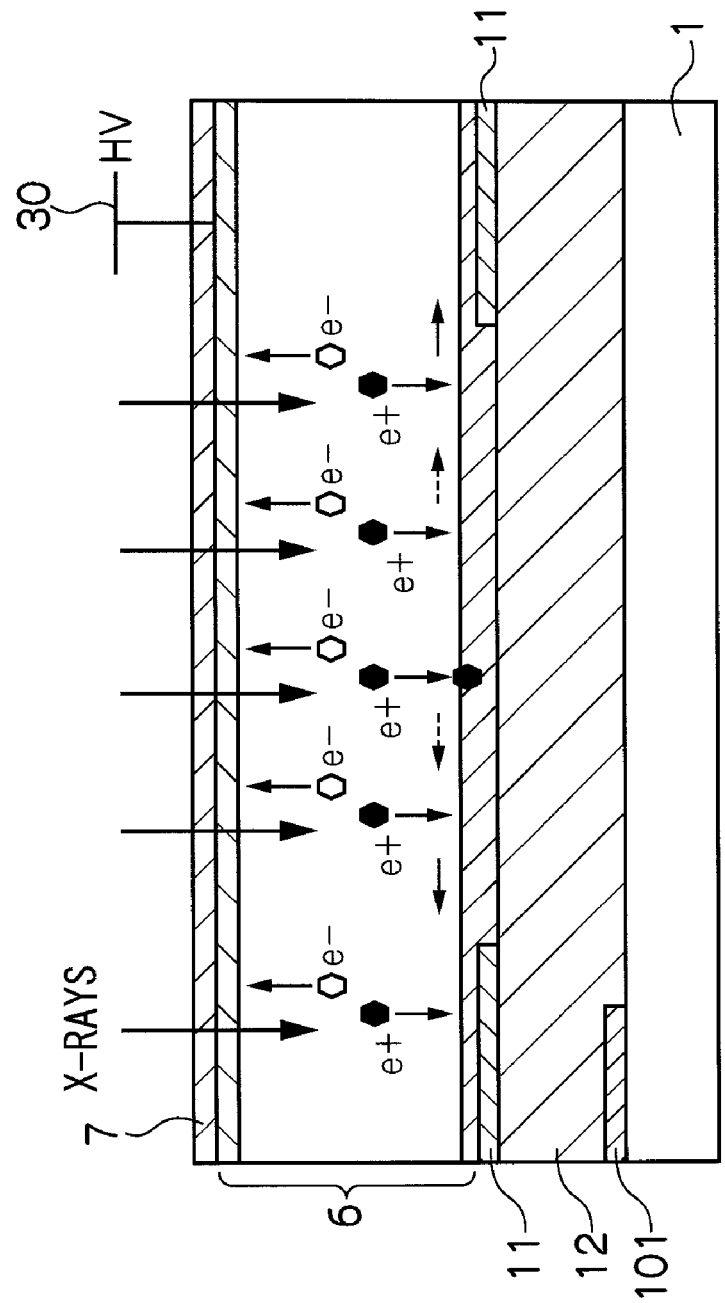
FIG. 6 is a schematic view illustrating a state in which charge generated in a semiconductor layer is being collected at a scan line region of the electromagnetic wave detecting element relating to the second exemplary embodiment.

FIG. 6 schematically illustrates a state in which charges generated in the semiconductor layer 6 are being collected at the scan line 101 region of the electromagnetic wave detecting element 10 relating to the present exemplary embodiment. Note that, FIG. 6 is a cross sectional view along line B-B of FIG. 5.

As shown in FIG. 5, the portion of the lower electrode 11 provided extending to the one side in the signal line direction and the lower electrode 11 is superposed with the adjacent scan line 101. Due thereto, because the lower electrode 11 is provided at positions at which the scan line 101 is disposed and collects charges in the semiconductor layer 6, trapping of charges in the semiconductor layer 6 may be suppressed.

If the lower electrode 11 is superposed with the scan line 101 to which the lower electrode 11 is electrically connected, as in the first exemplary embodiment, switching noise that occurs when the TFT switch 4 is switching would be greater. That is, if the lower electrode 11 is superposed with the scan line 101 to which the lower electrode 11 is electrically connected, at a time of switching of the TFT switch 4, the potential of the lower electrode 11 is changed by coupling because of a change in voltage applied to the scan line 101. This change in potential is a cause of noise. In contrast, if the lower electrode 11 is superposed with the scan line 101 that is adjacent to the one side in the signal line direction, as in the present exemplary embodiment, the potential of the scan line 101 coupled with the lower electrode 11 does not change at a time of switching of the TFT switch 4 of a subject pixel (i.e., at a time of reading). Therefore, the present exemplary embodiment may suppress noise.

As described above, according to the present exemplary embodiment, a portion of the lower electrode 11 is extended, and a portion of the gap 19 between the respective adjacent lower electrodes 11 is provided so as to avoid positions at which the scan line 101 is disposed. Further, because the lower electrode 11 is provided at a portion of positions at which the scan line 101 is disposed, the present exemplary embodiment may suppress trapping of charge in the semiconductor layer 6.

In a related art radiation image photography device, 10 seconds after irradiation of 600 mR, a residual image of 0.2 mR is formed. By contrast, according to experimental results from the inventors, with the present constitution, the residual image can be reduced to 0.04 mR.

Figure 7:
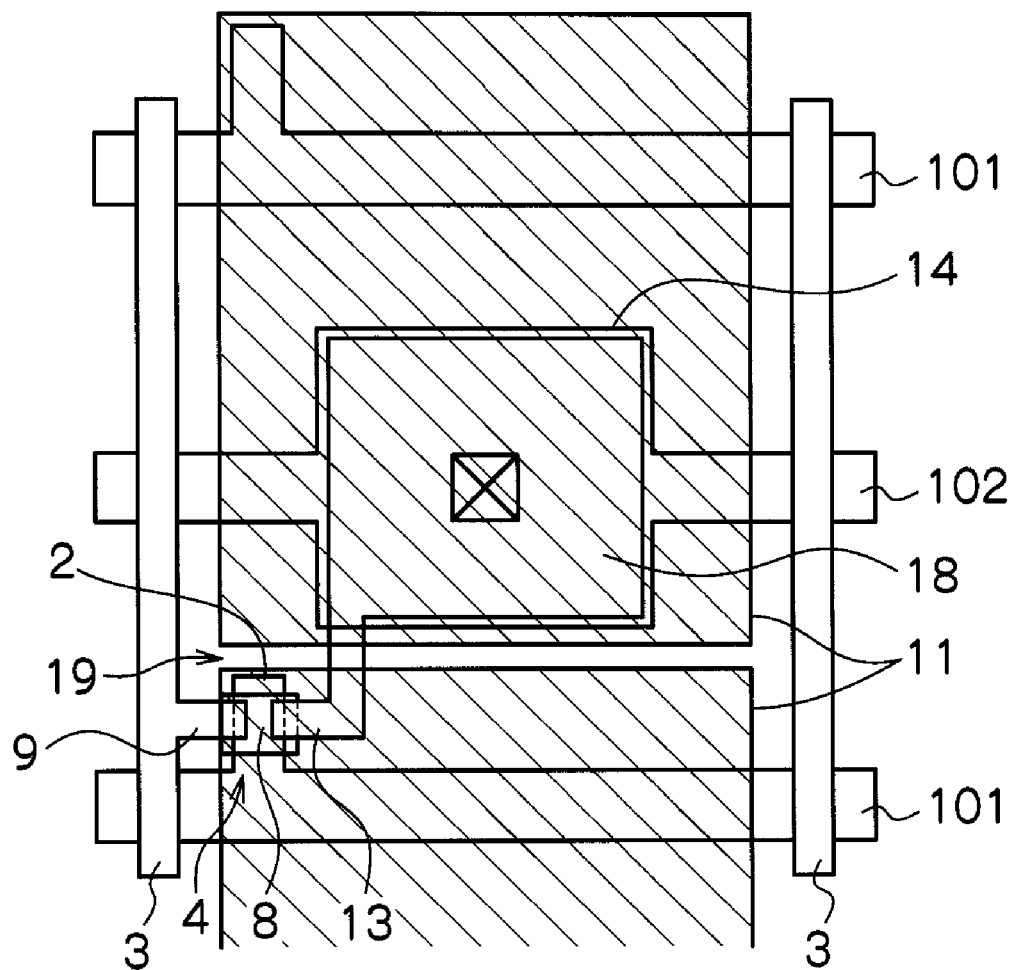
FIG. 7 is a plan view illustrating another structure of an electromagnetic wave detecting element relating to an exemplary embodiment.
Figure 8:
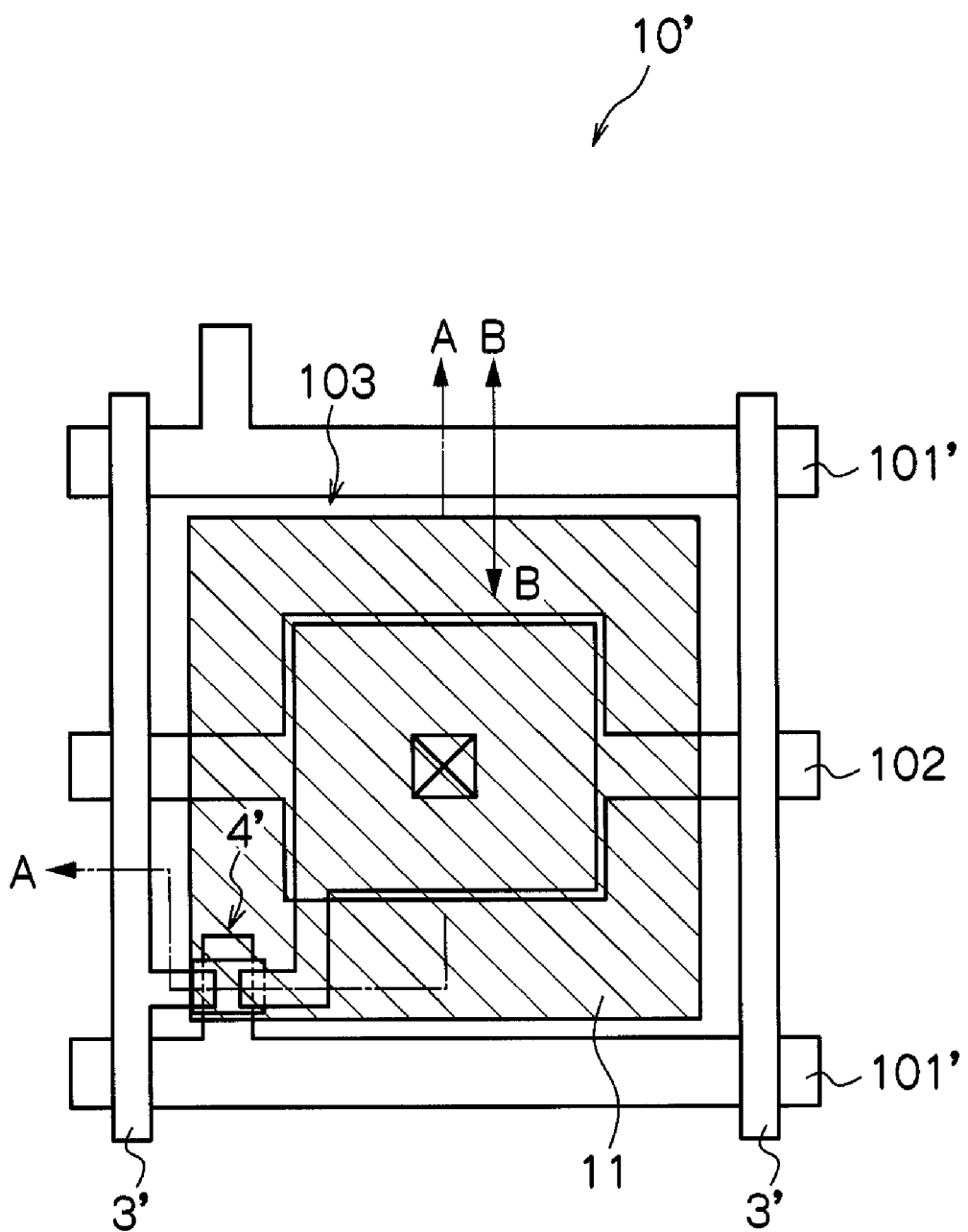
FIG. 8 is a plan view illustrating structure of one pixel unit of a related art electromagnetic wave detecting element.
Figure 9:
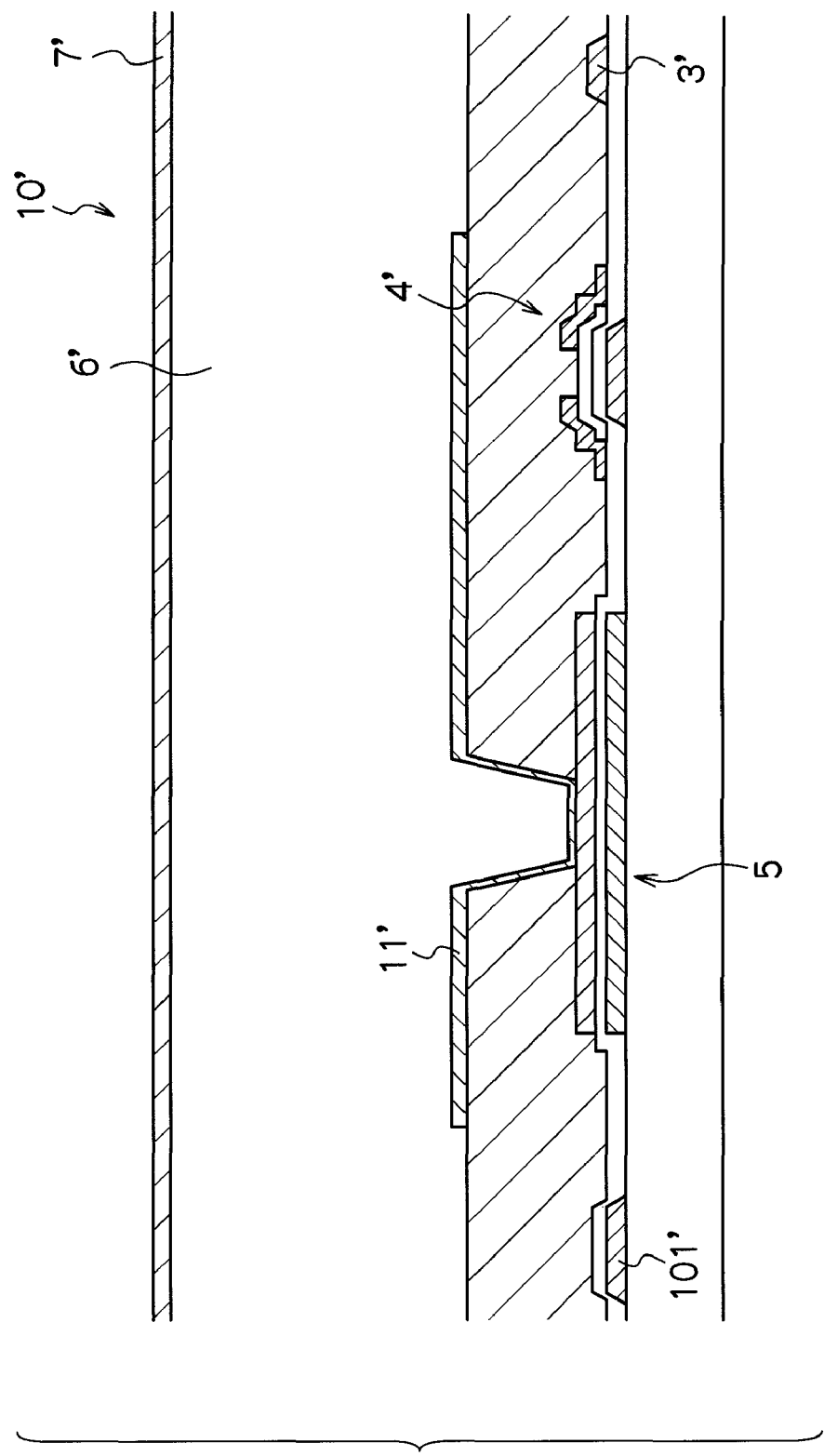
FIG. 9 is a cross-sectional view of the related art electromagnetic wave detecting element.
Figure 10:
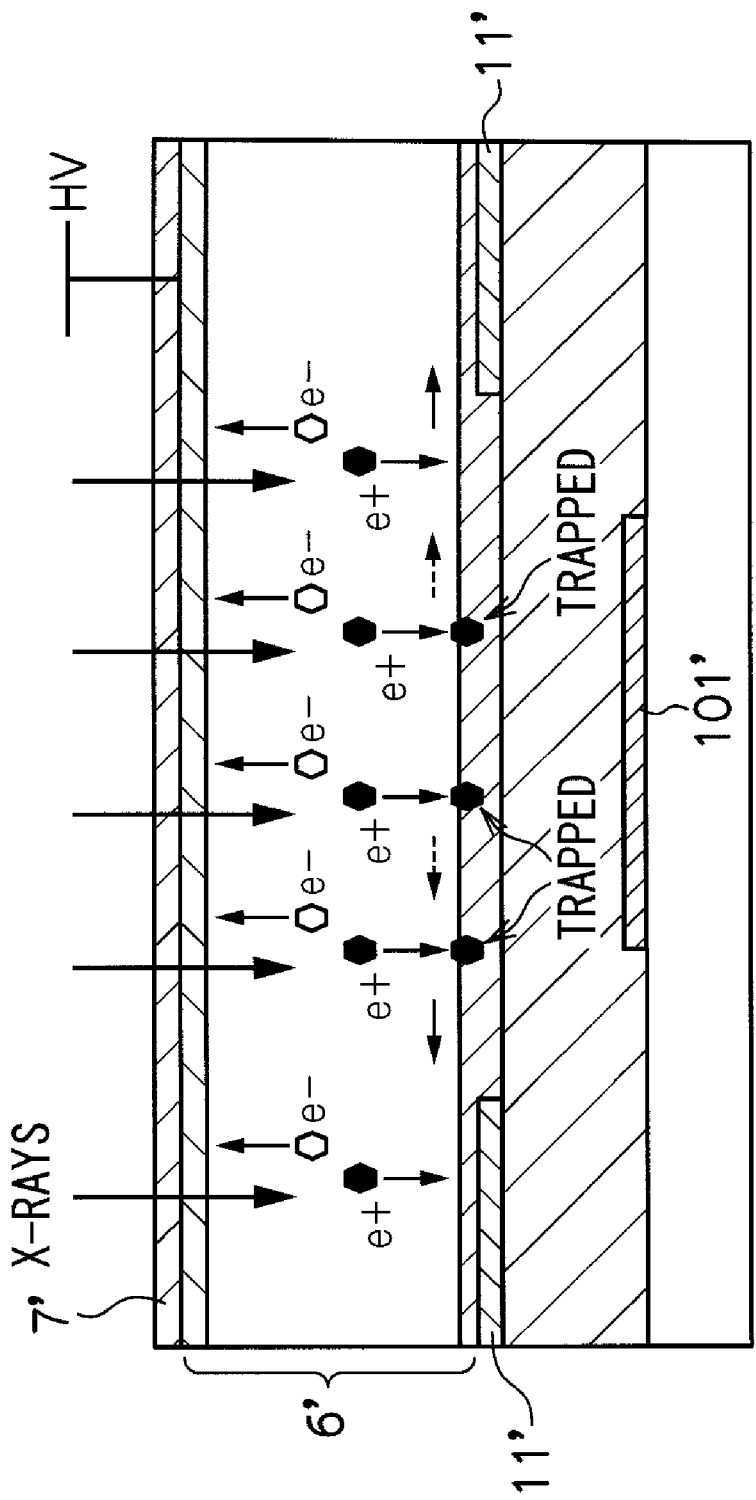
FIG. 10 is a schematic view illustrating a state in which charge generated in a semiconductor layer is being collected at a scan line region of the related art electromagnetic wave detecting element.
Figure 11:
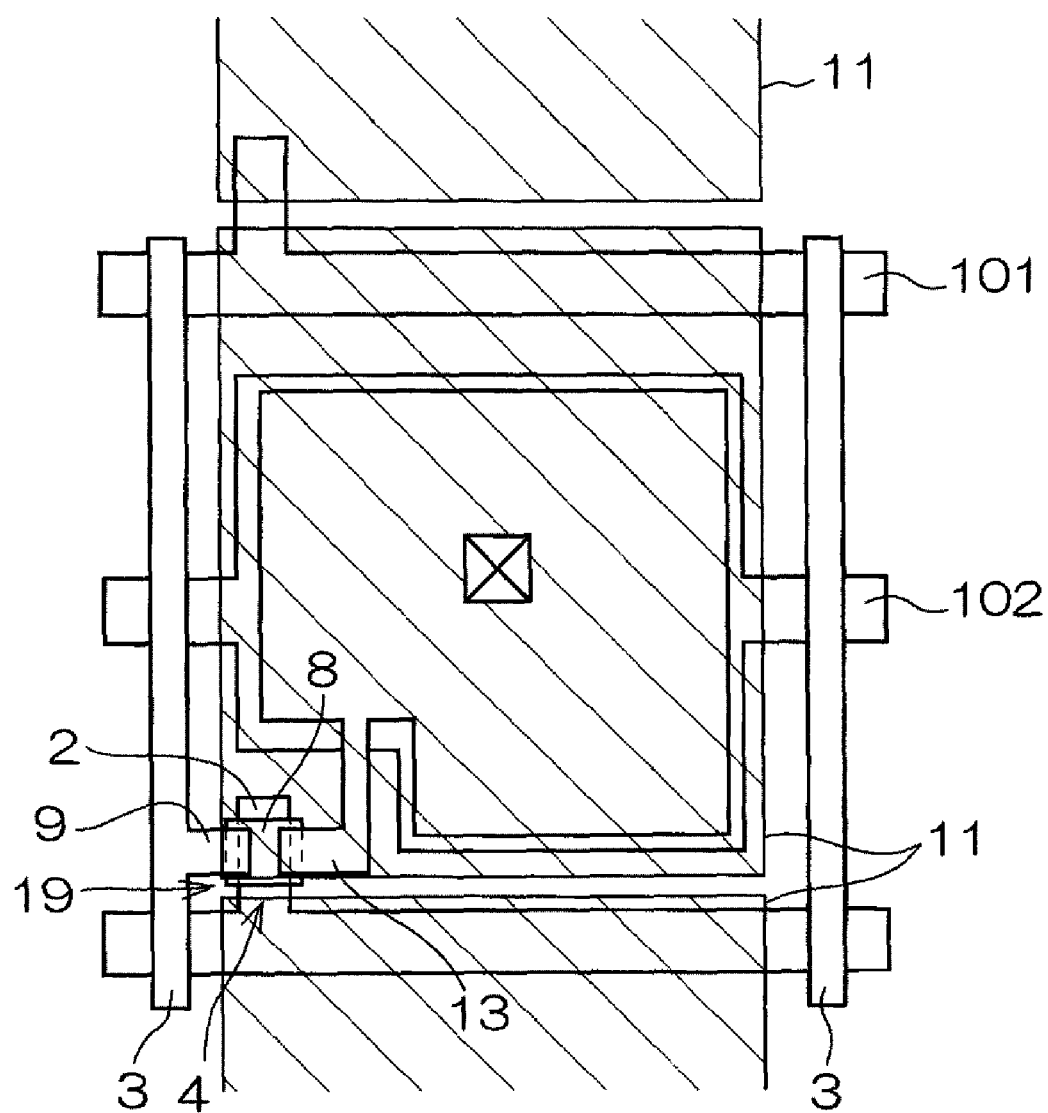
FIG. 11 is a plan view illustrating another structure of an electromagnetic wave detecting element relating to an exemplary embodiment.

Now, for the exemplary embodiments described above, cases have been described in which the lower electrode 11 is superposed with the scan line 101 by the lower electrode 11 being provided extending in the signal line direction. However, the present invention is not to be limited thus. For example, as shown in FIG. 11, the lower electrode 11 may be provided to be shifted in the signal line direction and thus be superposed with the adjacent scan line 101 while covering the TFT switch 4 to which the lower electrode 11 is electrically connected. As a further example, as shown in FIG. 7, the lower electrode 11 may be shifted further in the signal line direction and thus the lower electrode 11 may be superposed with the TFT switch 4 of the adjacent pixel and with the adjacent scan line 101.

Further, for the above exemplary embodiments, cases have been described in which the present invention is applied to the radiation image photography device 100 that detects an image by detecting X-rays, which serve as the electromagnetic waves that are the detection object. However, the present invention is not to be limited thus. For example, the electromagnetic waves that are the detection object may be any of visible light, ultraviolet light, infrared light and so forth.

Further, for the above exemplary embodiments, cases have been described in which the present invention is applied to the radiation image photography device 100 employing the direct conversion-type electromagnetic wave detecting element 10 that directly converts radiation to charges in the semiconductor layer and accumulates the same. However, the present invention is not to be limited thus. For example, the present invention may be applied to a radiation image photography device employing an indirect conversion-type electromagnetic wave detecting element that temporarily converts radiation to light with a scintillator, converts the converted light to charge in a semiconductor layer and accumulates the same.

Furthermore, the constitution of the radiation image photography device 100 described in the above exemplary embodiments (see FIG. 1) and the constitutions of the electromagnetic wave detecting element 10 (FIG. 2 to FIG. 7) are examples. Suitable modifications are possible within a scope not departing from the spirit of the present invention.

What is claimed is:

1. An electromagnetic wave detecting element comprising:
   an insulative substrate;
   a plurality of scan lines and a plurality of signal lines that are disposed on the insulative substrate, to intersect one another, in different wiring layers with a first insulation film interposed;
   a plurality of collection electrodes, that collects generated charges, disposed respectively individually in correspondence with intersection portions of the plurality of scan lines and the plurality of signal lines, on a second insulation film layered above the plurality of scan lines and the plurality of signal lines; and
   a semiconductor layer, that generates charges when irradiated with predetermined electromagnetic waves, uniformly formed on a layer above the plurality of collection electrodes,
   wherein the plurality of collection electrodes are provided to each cover at least a portion in a longitudinal direction and the entire region in a lateral direction of at least one of the scan line or signal line that are adjacent to the respective collection electrode.

2. The electromagnetic wave detecting element according to claim 1, wherein the plurality of collection electrodes are each provided with a portion extended over the second insulation film such that the respective collection electrode covers the at least a portion in the longitudinal direction and the entire region in the lateral direction of the at least one of the scan line or signal line.

3. The electromagnetic wave detecting element according to claim 2, wherein the plurality of collection electrodes are each provided to cover the at least a portion in the longitudinal direction and the entire region in the lateral direction of the scan line that is adjacent thereto.

4. The electromagnetic wave detecting element according to claim 3, wherein
   the plurality of scan lines each control extraction to the signal lines of the charges collected at the collection electrodes that are adjacent to the respective scan line at one side in the signal line direction, and
   the plurality of collection electrodes are superposed with the scan lines that are adjacent thereto at the one side in the signal line direction.

5. The electromagnetic wave detecting element according to claim 4, wherein the plurality of collection electrodes are superposed, with the scan lines that are respectively adjacent at the one side in the signal direction, with a predetermined alignment margin.

6. The electromagnetic wave detecting element according to claim 1, wherein the plurality of collection electrodes are each provided to cover the at least a portion in the longitudinal direction and the entire region in the lateral direction of the scan line that is adjacent thereto.

7. The electromagnetic wave detecting element according to claim 6, wherein
   the plurality of scan lines each control extraction to the signal lines of the charges collected at the collection electrodes that are adjacent to the respective scan line at one side in the signal line direction, and
   the plurality of collection electrodes are superposed with the scan lines that are adjacent thereto at the one side in the signal line direction.

8. The electromagnetic wave detecting element according to claim 7, wherein the plurality of collection electrodes are superposed, with the scan lines that are respectively adjacent at the one side in the signal direction, with a predetermined alignment margin.

9. The electromagnetic wave detecting element according to claim 1, further comprising:
   a plurality of thin film transistors, that are disposed respectively individually in correspondence with the intersection portions of the plurality of scan lines and the plurality of signal lines, the plurality of thin film transistors including,
   gate electrodes, electrically connected with the scan lines,
   source electrodes, electrically connected with either one of the signal lines or the collection electrodes, and
   drain electrodes, electrically connected with the other of the signal lines or the collection electrodes,
   wherein the plurality of collection electrodes are disposed to cover the thin film transistors to which the collection electrodes are electrically connected.

* * * * *